United States Patent
Silverman

(10) Patent No.: US 12,451,632 B2
(45) Date of Patent: Oct. 21, 2025

(54) ORTHOGONAL CIRCUIT BOARD INTERCONNECTION SYSTEMS

(71) Applicant: Lockheed Martin Corporation, Bethesda, MD (US)

(72) Inventor: Alexander John Silverman, Wilmington, DE (US)

(73) Assignee: Lockheed Martin Corporation, Bethesda, MD (US)

( * ) Notice: Subject to any disclaimer, the term of this patent is extended or adjusted under 35 U.S.C. 154(b) by 404 days.

(21) Appl. No.: 18/069,788

(22) Filed: Dec. 21, 2022

(65) Prior Publication Data
US 2024/0213697 A1   Jun. 27, 2024

(51) Int. Cl.
| | | |
|---|---|---|
| *H01R 12/73* | (2011.01) | |
| *H01R 12/72* | (2011.01) | |
| *H05K 1/14* | (2006.01) | |
| *H01R 12/55* | (2011.01) | |
| *H01R 13/24* | (2006.01) | |
| *H01R 13/405* | (2006.01) | |

(52) U.S. Cl.
CPC ......... *H01R 12/737* (2013.01); *H01R 12/727* (2013.01); *H05K 1/141* (2013.01); *H01R 12/55* (2013.01); *H01R 13/24* (2013.01); *H01R 13/405* (2013.01); *H05K 2201/10378* (2013.01)

(58) Field of Classification Search
CPC .............. H01L 25/0657; H01L 23/32; H01L 225/06572; H01R 12/737; H01R 12/727; H01R 12/722; H05K 3/366
See application file for complete search history.

(56) References Cited

U.S. PATENT DOCUMENTS

| | | | | |
|---|---|---|---|---|
| 3,624,587 | A * | 11/1971 | Conrad | H01R 12/718 439/325 |
| 4,630,874 | A * | 12/1986 | Renn | H01R 12/88 439/495 |
| 5,366,380 | A * | 11/1994 | Reymond | H01R 12/712 439/700 |
| 7,556,503 | B2 | 7/2009 | Vinther | |
| 7,802,993 | B2 | 9/2010 | Akama et al. | |

(Continued)

OTHER PUBLICATIONS https://www.smithsinterconnect.com/CMSPages/GetFile.aspx?guid=60393f19-bb14-48e4-9cc3-8c2c8e9cd90f Smiths Interconnect, Bringing technology to life; Interposers; Custom Spring Probe Solutions.

(Continued)

*Primary Examiner* — Vanessa Girardi
(74) *Attorney, Agent, or Firm* — Baker Botts L.L.P.

(57) ABSTRACT

According to some embodiments, an interface assembly for coupling an orthogonal circuit board to a main circuit board includes a frame, signal pins, and dielectric retainers. The frame is electrically coupled to a ground signal of the orthogonal circuit board. The dielectric retainers electrically isolate the plurality of signal pins from the frame. The frame includes an interface surface configured to electrically couple the frame to a plurality of ground spring pins of a spring interposer of the main circuit board. Each particular signal pin of the interface assembly includes a pin head configured to electrically couple the particular signal pin to a particular one of a plurality of signal spring pins of the spring interposer. The interface surface of the frame and the pin heads of the plurality of signal pins form a coplanar surface.

20 Claims, 8 Drawing Sheets

(56) References Cited

U.S. PATENT DOCUMENTS

| | | | | |
|---|---|---|---|---|
| 7,922,544 B2* | 4/2011 | Chung | ............... | G01R 1/06722 |
| | | | | 439/700 |
| 8,597,034 B2* | 12/2013 | Morana | ................ | H01R 13/187 |
| | | | | 439/65 |
| 8,837,141 B2* | 9/2014 | Clayton | ................. | H05K 3/366 |
| | | | | 29/830 |
| 9,583,853 B2 | 2/2017 | Cartier, Jr. et al. | | |
| 9,728,524 B1* | 8/2017 | Tao | ........................ | H05K 1/181 |
| 10,157,822 B1* | 12/2018 | Zhou | ........................ | H01L 23/60 |

OTHER PUBLICATIONS https://www.ardentconcepts.com/tr/#.YlhpAYvML-g Ardent Concepts, an Amphenol Company, TR Multicoax Series—TR20/TR40/TR70.

https://www.samtec.com/cables/high-speed/test/bulls-eye Bulls Eye® High-Performance Test to 7-GHZ.

* cited by examiner

ORTHOGONAL CIRCUIT BOARD INTERCONNECTION SYSTEMS

TECHNICAL FIELD

This disclosure generally relates to circuit boards, and more specifically to orthogonal circuit board interconnection systems.

BACKGROUND

In some applications, two circuit boards may be coupled together using connectors. For example, traditional push-on style connectors (e.g., SMP, SMP-M, SMP-S, etc.) may be used for blind-mate orthogonal board installations in radio frequency (RF) applications. Such connectors utilize individual "bullets" for each signal, leading to costly components and extended assembly time. In addition, these interconnects require a certain amount of engagement force per signal pin (e.g., 1.2-2.5 lbs.). For systems that include high signal counts, this results in large amounts of force required to engage the connections as well as methods to verify bullets do not become misaligned during installation in a blind-mate application.

SUMMARY OF THE DISCLOSURE

According to some embodiments, an interface assembly for coupling an orthogonal circuit board to a main circuit board includes a frame, signal pins, and dielectric retainers. The frame is electrically coupled to a ground signal of the orthogonal circuit board. The dielectric retainers electrically isolate the plurality of signal pins from the frame. The frame includes an interface surface configured to electrically couple the frame to a plurality of ground spring pins of a spring interposer of the main circuit board. Each particular signal pin of the interface assembly includes a pin head configured to electrically couple the particular signal pin to a particular one of a plurality of signal spring pins of the spring interposer. The interface surface of the frame and the pin heads of the plurality of signal pins form a coplanar surface.

According to other embodiments, a system includes a main circuit board and an orthogonal circuit board coupled to the main circuit board via an interface assembly. Between the main circuit board and the orthogonal circuit board is a spring interposer connector that includes a plurality of signal spring pins and a plurality of ground spring pins. Each signal spring pin is electrically coupled to a respective signal of the main circuit board and each ground spring pin is electrically coupled to a ground signal of the main circuit board. The interface assembly includes a ground frame, a plurality of signal pins, and a plurality of dielectric retainers. The ground frame is electrically coupled to a ground signal of the orthogonal circuit board. Each signal pin is electrically coupled to a respective signal of the orthogonal circuit board. The dielectric retainers are configured to electrically isolate the plurality of signal pins from the ground frame. The ground frame includes an interface surface that is configured to electrically couple the ground frame to the plurality of ground spring pins of the spring interposer connector. Each particular signal pin of the interface assembly includes a pin head that is configured to electrically couple the particular signal pin to a particular one of the plurality of signal spring pins of the spring interposer connector. The interface surface of the ground frame and the pin heads of the plurality of signal pins form a coplanar surface on the interface assembly.

According to other embodiments, a system includes a first circuit board, a spring interposer, and a second circuit board coupled to the first circuit board via an interface assembly. The spring interposer includes a plurality of signal spring pins and a plurality of ground spring pins. The interface assembly includes a frame electrically coupled to a ground signal of the second circuit board, a plurality of signal pins, and a plurality of dielectric retainers configured to electrically isolate the plurality of signal pins from the frame. The frame includes an interface surface configured to electrically couple the frame to the plurality of ground spring pins of the spring interposer. Each particular signal pin of the interface assembly includes a pin head configured to electrically couple the particular signal pin to a particular one of the plurality of signal spring pins of the spring interposer. The interface surface of the frame and the pin heads of the plurality of signal pins form a coplanar surface.

Technical advantages of certain embodiments may include providing systems for connecting an orthogonal circuit board to a main circuit board using an orthogonal-to-parallel interface assembly. Instead of typical push-on connectors that require individual bullets to be installed for each connection, the orthogonal-to-parallel interface assembly of the disclosed embodiments includes signal pins and a ground frame in a single package. This eliminates the need to employ methods to maintain alignment during installation, thereby simplifying designs and system assembly/installation. Furthermore, because the disclosed systems utilize traditional spring interposers with low contact forces compared to push-on style connectors, many simultaneous connections can be made while maintaining lower overall assembly forces. Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the disclosed embodiments and their features and advantages, reference is now made to the following description, taken in conjunction with the accompanying drawings, in which.

DETAILED DESCRIPTION OF THE DISCLOSURE

Figure 1:
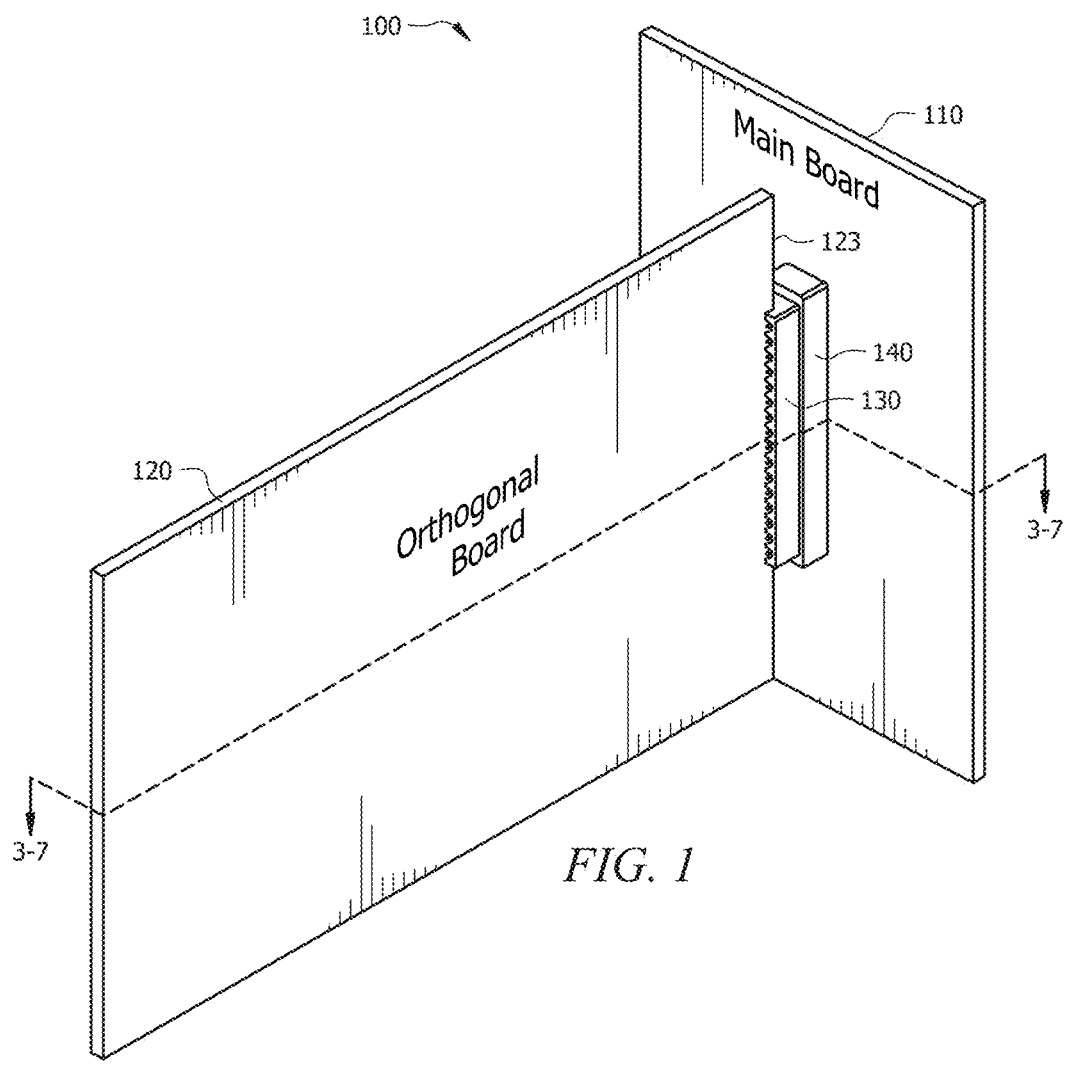
FIG. 1 illustrates an orthogonal coaxial connection system.

In some applications, two circuit boards may be coupled together using connectors. For example, traditional push-on style connectors (e.g., SMP, SMP-M, SMP-S, etc.) may be used for blind-mate orthogonal board installations in radio frequency (RF) applications. Such connectors utilize individual "bullets" for each signal, leading to costly components and extended assembly time. In addition, these interconnects require a certain amount of engagement force per signal pin (e.g., 1.2-2.5 lbs.). For systems that include high signal counts, this results in large amounts of force required to engage the connections as well as methods to verify bullets do not become misaligned during installation in blind-mate applications.

Some applications utilize spring-style interposers, which contain compressible spring contacts housed in a frame. Such interposers are used in many parallel board-to-board applications (i.e., mezzanine applications), but solutions do not exist for orthogonal board-to-board assembly methods. Some applications may utilize spring pins that can be attached to an edge of the circuit board, but such solutions lack surrounding ground contacts. This prevents their use for orthogonal RF applications. Furthermore, push-on RF interconnects require separate parts ("bullets") to connect between circuit boards. These solutions are expensive, require excessive assembly times, are difficult to align, and require high engagement forces.

To address these and other problems with orthogonal board-to-board connector systems, the present disclosure provides systems for connecting an orthogonal circuit board to a main circuit board using an orthogonal-to-parallel interface assembly. The orthogonal-to-parallel interface assembly allows the orthogonal circuit board to interface with a conventional spring interposer coupled to the main circuit board. The orthogonal-to-parallel interface assembly includes conductive center signal pins, surrounding dielectric retainers, and an outer conductive ground frame. The pin heads of the signal pins and the ground frame form a coplanar contact plane away from the edge of the orthogonal circuit board, thereby allowing a parallel connection to be made to the spring interposer of the mating main circuit board. As a result, the requirement of current solutions to install individual bullets for each connection is eliminated, thereby saving cost and assembly time. Because the orthogonal-to-parallel interface assembly of the disclosed embodiments includes signal pins and a ground frame in a single package, methods to maintain alignment between signals during installation are also not required. This simplifies designs and system assembly/installation. Furthermore, because the disclosed systems utilize traditional spring interposers with low contact forces compared to push-on style connectors, many simultaneous connections can be made while maintaining lower overall assembly forces. These and other advantages are discussed in more detail below.

To facilitate a better understanding of the present disclosure, the following examples of certain embodiments are given. In no way should the following examples be read to limit or define the scope of the disclosure. Embodiments of the present disclosure and its advantages may be best understood by referring to the included FIGURES, where like numbers are used to indicate like and corresponding parts.

Figure 2A:
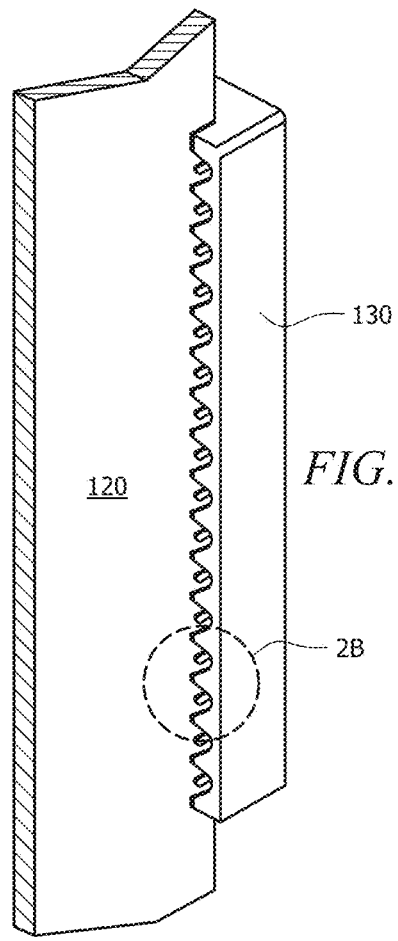
FIGS. 2A, 2B, 2C, and 2D illustrate an orthogonal-to-parallel interface assembly.
Figure 2B:
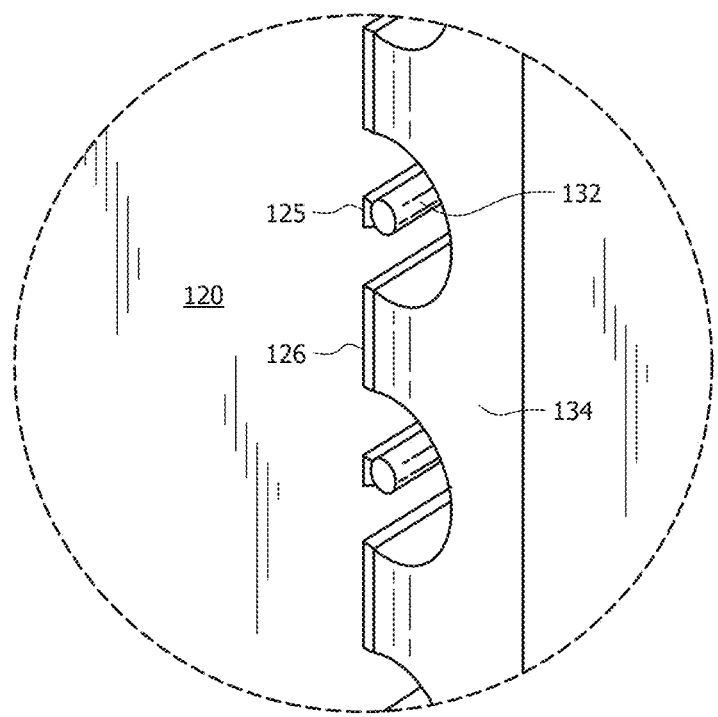
Figure 2C:
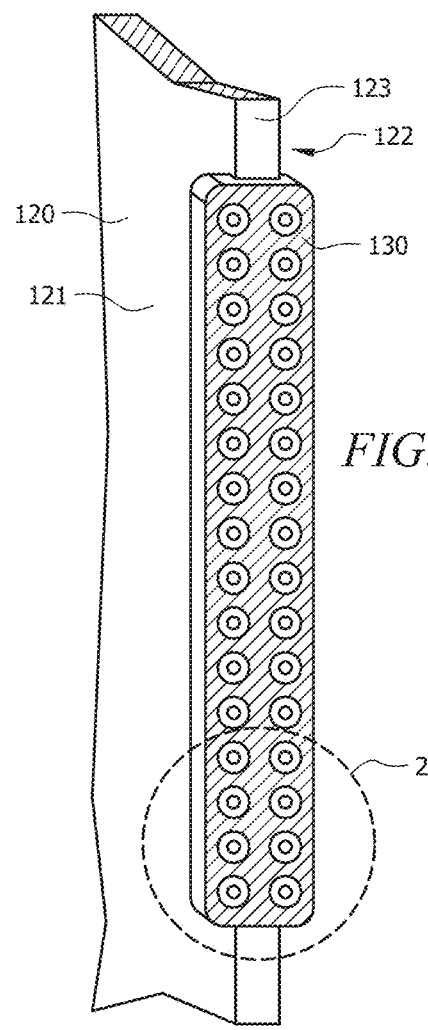
Figure 2D:
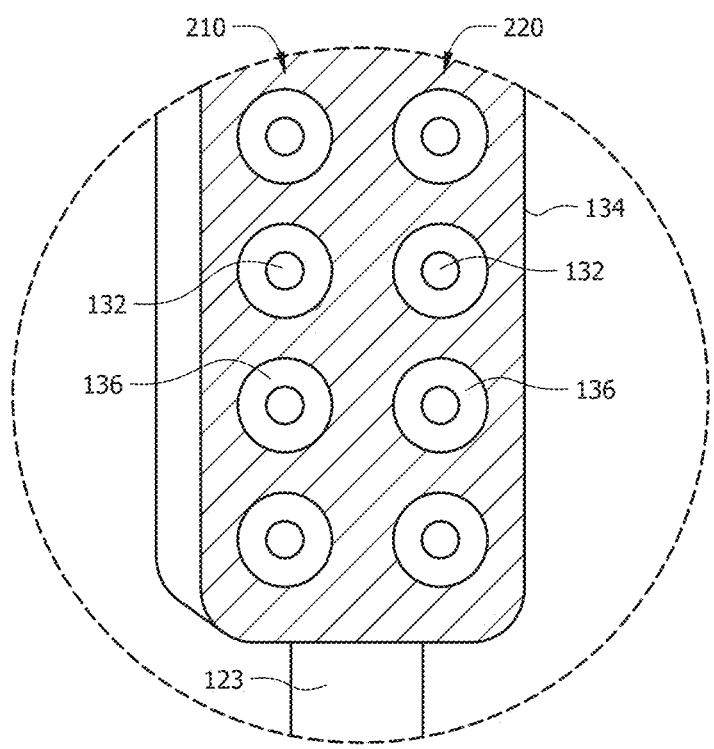
Figure 3:
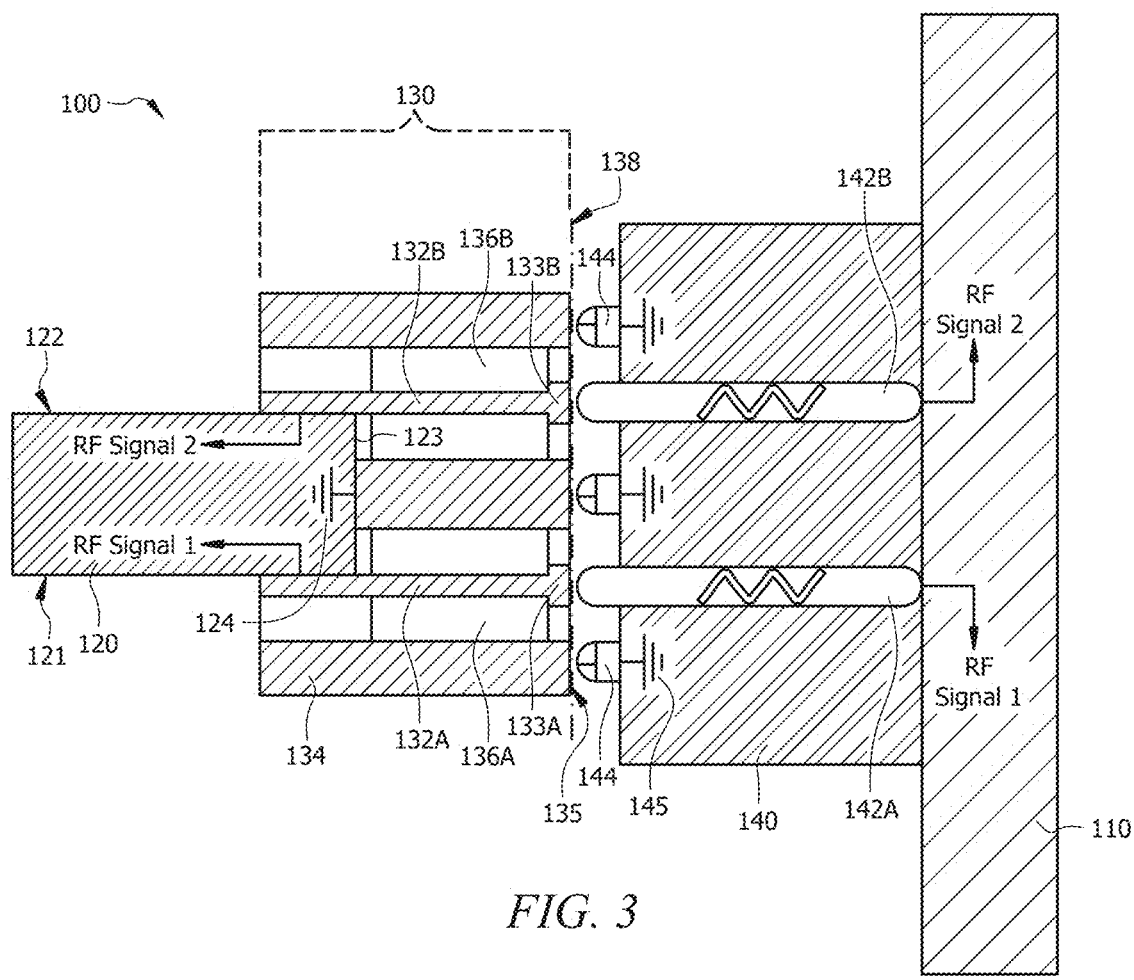
FIG. 3 illustrates a cutaway view of an orthogonal coaxial connection system.

FIG. 1 illustrates an orthogonal coaxial connection system 100, FIGS. 2A-2D illustrate an orthogonal-to-parallel interface assembly 130, and FIG. 3 illustrates a cutaway view of the orthogonal coaxial connection system 100 of FIG. 1, according to some embodiments. Orthogonal coaxial connection system 100 includes a main circuit board 110, an orthogonal circuit board 120, an orthogonal-to-parallel interface assembly 130 coupled to orthogonal circuit board 120, and a spring interposer 140 coupled to main circuit board 110.

In general and in reference to FIG. 1-3, orthogonal-to-parallel interface assembly 130 allows orthogonal circuit board 120 to interface with a conventional spring interposer board 140 coupled to main circuit board 110. Orthogonal-to-parallel interface assembly 130 includes conductive center signal pins 132, surrounding dielectric retainers 136, and an outer conductive ground frame 134. The pin heads 133 of signal pins 132 and the ground frame 134 form a coplanar contact plane 138 a predetermined distance (e.g., 0.1 inch) away from edge 123 of orthogonal circuit board 120, thereby allowing a parallel signal connection to be made to spring interposer 140 of the mating main circuit board 110.

Main circuit board 110 and orthogonal circuit board 120 are circuit boards that are to be mated to each other in an orthogonal board-to-board assembly. That is, orthogonal circuit board 120 is mated/connected to main circuit board 110 at a right angle as opposed to parallel board-to-board applications (i.e., mezzanine applications). In parallel board-to-board applications, connectors are coupled to the flat sides of two circuit boards which results in the two circuit boards being parallel to each other when mated. In orthogonal coaxial connection system 100, however, an edge 123 of orthogonal circuit board 120 is mated to a side of main circuit board 110. This results in orthogonal circuit board 120 being orthogonal to main circuit board 110 when mated. Main circuit board 110 and orthogonal circuit board 120 may be any size or shape and may be used for any appropriate application (e.g., RF applications, digital applications, etc.).

Orthogonal-to-parallel interface assembly 130 is a unique connector that is coupled to an edge 123 of orthogonal circuit board 120 that allows orthogonal circuit board 120 to be mated to main circuit board 110 at a right angle. Orthogonal-to-parallel interface assembly 130 includes signal pins 132, dielectric retainers 136 (e.g., 136A and 136B), and a ground frame 134. Each signal pin 132 (e.g., 132A and 132B) is electrically coupled to a respective signal of orthogonal circuit board 120. For example, signal pin 132A may be soldered to a signal pad 125 of orthogonal circuit board 120 that is coupled (e.g., via traces) to a signal labeled "RF SIGNAL 1." Likewise, signal pin 132B may be soldered to a signal pad 125 of orthogonal circuit board 120 that is coupled (e.g., via traces) to a signal labeled "RF SIGNAL 2."

Ground frame 134 is formed from any appropriate conductive material (e.g., metal). Ground frame 134 is electrically coupled to a ground signal 124 of orthogonal circuit board 120. For example, ground frame 134 may be soldered to a ground pad 126 of orthogonal circuit board 120 that is coupled (e.g., via traces) to ground 124 of orthogonal circuit board 120. Ground frame 134 may be in any appropriate size or shape (e.g., a rectangle as illustrated).

Ground frame 134 includes a frame interface surface 135 that is configured to electrically couple ground frame 134 to spring ground pins 144 of spring interposer 140. Furthermore, each signal pin 132 includes a pin head 133 (e.g., 133A and 133B) that is configured to electrically couple the particular signal pin 132 to a particular spring signal pin 142 (e.g., 142A and 142B) of spring interposer 140. The frame interface surface 135 of ground frame 134 and the pin heads 133 of signal pins 132 form a coplanar surface 138 that is a certain distance away from ground frame 134.

Dielectric retainer 136 is any appropriate material that is capable of electrically isolating signal pin 132 from ground frame 134. In some embodiments, dielectric retainer 136 is formed from PTFE Fluoropolymer or any other similar material. Dielectric retainer 136 may partially or wholly envelope signal pin 132. In some embodiments, dielectric retainer 136 is cylindrical in shape with signal pin 132 running down the middle of the cylinder.

Spring interposer 140 is a connector that may be coupled to main circuit board 110 (e.g., via solder). Spring interposer 140 includes one or more spring signal pins 142 (e.g., 142A and 142B) that are electrically coupled to a respective signal of main circuit board 110. For example, spring signal pin 142A may be soldered to a signal pad of main circuit board 110 that is coupled (e.g., via traces) to a signal labeled "RF SIGNAL 1." Likewise, spring signal pin 142B may be soldered to a signal pad of main circuit board 110 that is coupled (e.g., via traces) to a signal labeled "RF SIGNAL 2." Similarly, signal pins 142A and 142B may be electrically connected via physical contact forces generated by internal springs. Spring interposer 140 also includes one or more spring ground pins 144 (e.g., 144A and 144B) that are electrically coupled to a ground signal 145 of main circuit board 110.

In some embodiments, spring interposer 140 has springs (e.g., spring signal pins 142) protruding from both sides of spring interposer 140. Such embodiments eliminate the need for solder and essentially making it a "floating" part that can be pre-attached to either main circuit board 110 or orthogonal circuit board 120 with orthogonal-to-parallel interface assembly 130.

Figure 4:
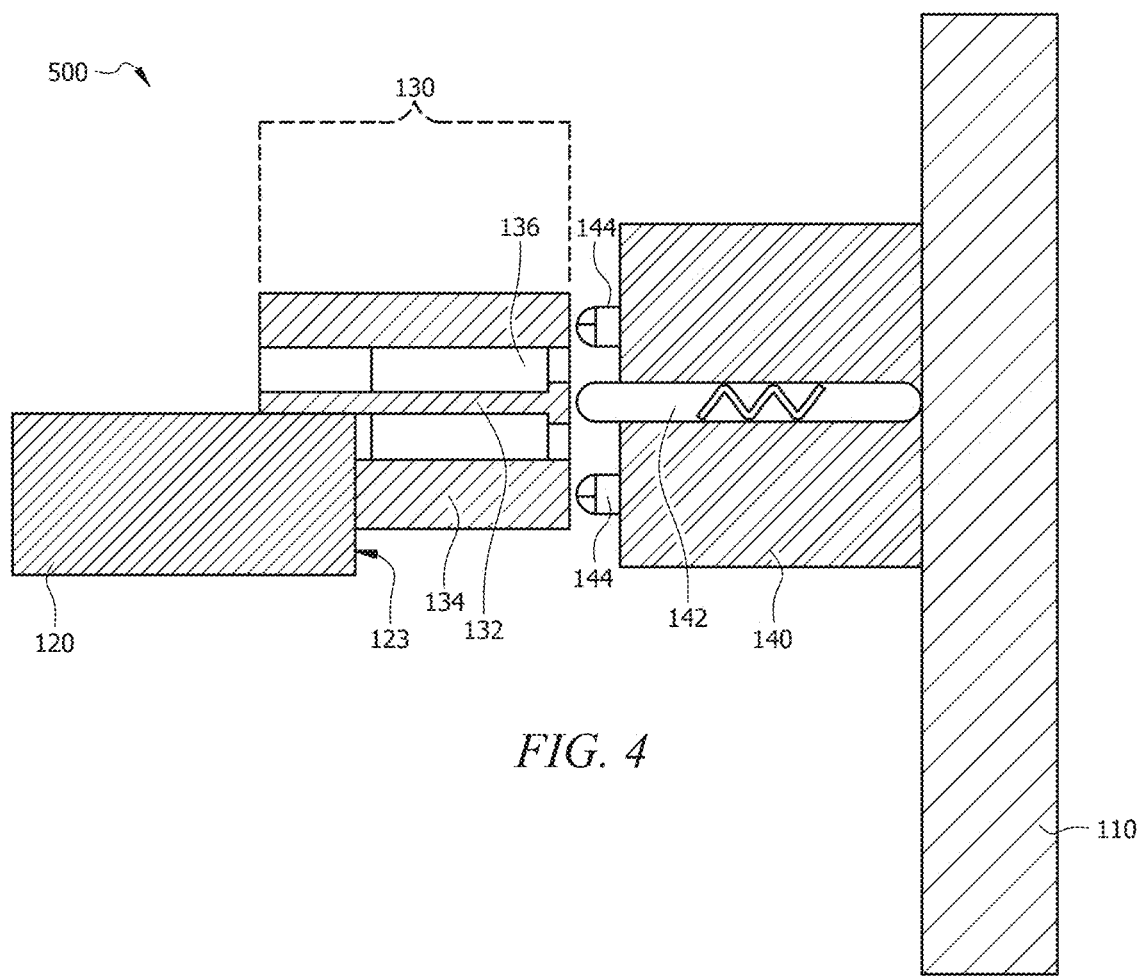
FIG. 4 illustrates a cutaway view of a single-sided, single-row orthogonal coaxial connection system.
Figure 5:
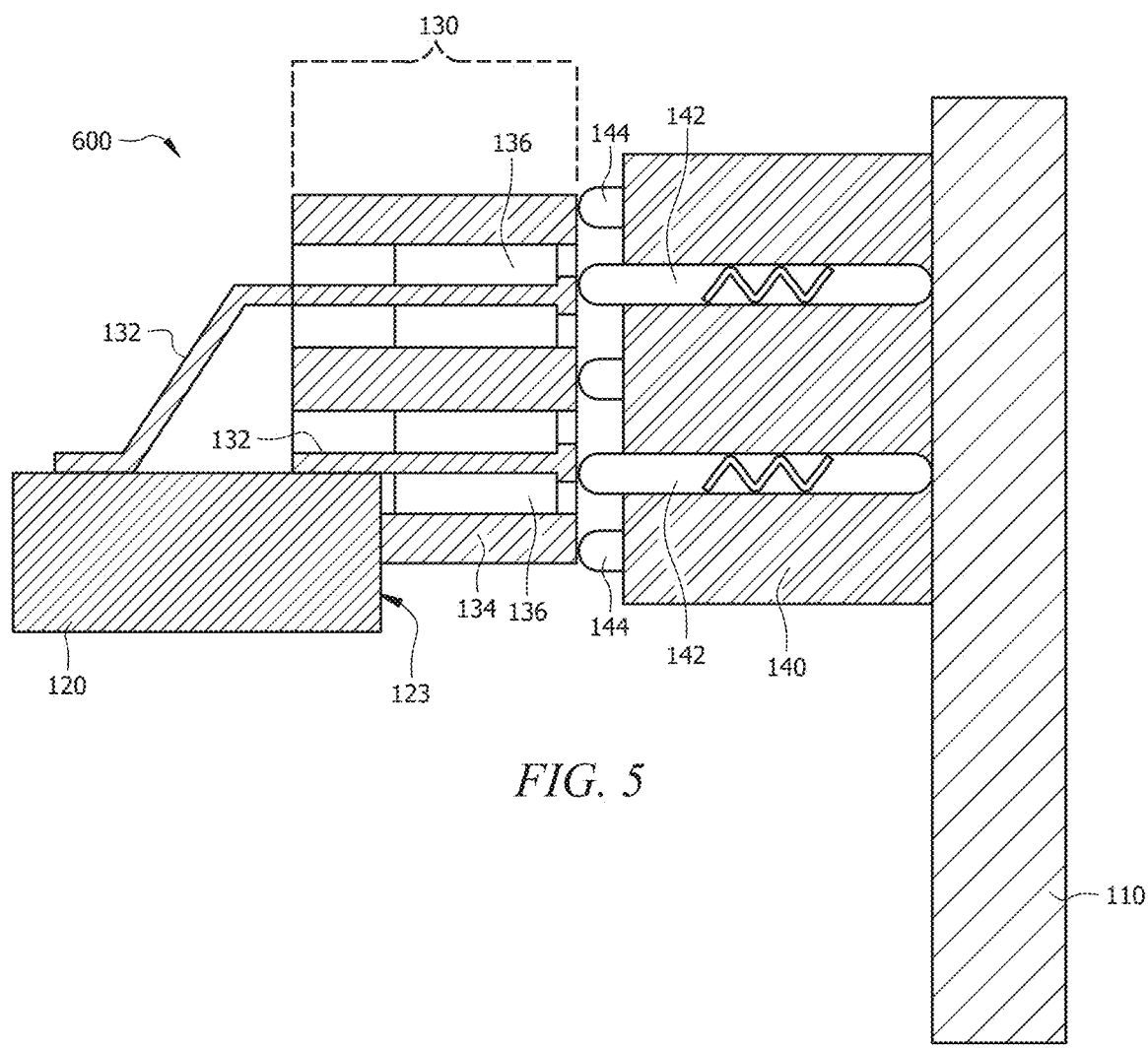
FIG. 5 illustrates a cutaway view of a single-sided, multi-row orthogonal coaxial connection system.

In some embodiments, as is illustrated in FIGS. 2A-3, orthogonal-to-parallel interface assembly 130 may include two rows of signal pins 132 (e.g., rows 210 and 220). In the embodiments of FIGS. 2A-3, each row of signal pins 132 is coupled to an opposite side of orthogonal circuit board 120. For example, the signal pins 132 of first row 210 are coupled to a first side 121 of orthogonal circuit board 120 and the signal pins 132 of second row 220 are coupled to a second side 122 of orthogonal circuit board 120. In other embodiments, however, orthogonal-to-parallel interface assembly 130 may include only a single row of signal pins 132 (e.g., as illustrated in FIG. 4). Furthermore, some embodiments of orthogonal-to-parallel interface assembly 130 may include two rows of signal pins 132 that are both coupled to the same side of orthogonal circuit board 120 (e.g., as illustrated in FIG. 5). Orthogonal-to-parallel interface assembly 130 may have any number of rows of signal pins 132 that are coupled to only one side or both sides of orthogonal circuit board 120.

In operation of certain embodiments and in reference to FIGS. 1-3, orthogonal circuit board 120 is mated to main circuit board 110 at a right angle using orthogonal-to-parallel interface assembly 130 and spring interposer 140. First, orthogonal-to-parallel interface assembly 130 is coupled to edge 123 of orthogonal circuit board 120. For example, orthogonal-to-parallel interface assembly 130 may be placed onto edge 123 of orthogonal circuit board 120 and then signal pins 132 may be soldered to pads on one or both sides of orthogonal circuit board 120 (e.g., sides 121 and 122). In addition, ground frame 134 may soldered to one or more ground pads on edge 123 and/or one or both sides 121 and 122 of orthogonal circuit board 120. Orthogonal circuit board 120 may then be mated to main circuit board 110 by inserting orthogonal-to-parallel interface assembly 130 into spring interposer 140. Once orthogonal-to-parallel interface assembly 130 is inserted into spring interposer 140, coplanar surface 138 contacts spring signal pins 142 and spring ground pins 144 of spring interposer 140. That is, as orthogonal-to-parallel interface assembly 130 is inserted into spring interposer 140, the pin heads 133 of signal pins 132 make electrical contact with spring signal pins 142 simultaneously with ground frame 134 making electrical contact with spring ground pins 144.

FIG. 4 illustrates a cutaway view of a single-sided, single-row orthogonal coaxial connection system 400, according to some embodiments. In this embodiment, orthogonal-to-parallel interface assembly 130 includes a single row of signal pins 132. As described above in reference to FIGS. 1-3, orthogonal-to-parallel interface assembly 130 of single-sided, single-row orthogonal coaxial connection system 400 is coupled to edge 123 of orthogonal circuit board 120. For example, orthogonal-to-parallel interface assembly 130 may be placed onto edge 123 of orthogonal circuit board 120 and then signal pins 132 may be soldered to pads on one side of orthogonal circuit board 120 (e.g., side 121 or 122). In addition, ground frame 134 may soldered to one or more ground pads on edge 123 and/or one side of orthogonal circuit board 120.

FIG. 5 illustrates a cutaway view of a single-sided, multi-row orthogonal coaxial connection system 500, according to some embodiments. In this embodiment, orthogonal-to-parallel interface assembly 130 includes two rows of signal pins 132 that are coupled to the same side of orthogonal circuit board 120. As described above in reference to FIGS. 1-3, orthogonal-to-parallel interface assembly 130 of single-sided, multi-row orthogonal coaxial connection system 500 is coupled to edge 123 of orthogonal circuit board 120. For example, orthogonal-to-parallel interface assembly 130 may be placed onto edge 123 of orthogonal circuit board 120 and then signal pins 132 of both rows may be soldered to pads on one side of orthogonal circuit board 120 (e.g., side 121 or 122). In addition, ground frame 134 may be soldered to one or more ground pads on edge 123 and/or one side of orthogonal circuit board 120. Leaders may be used to connect signal pins 132 of the outer row of orthogonal-to-parallel interface assembly 130 to orthogonal circuit board 120, as illustrated.

Figure 6:
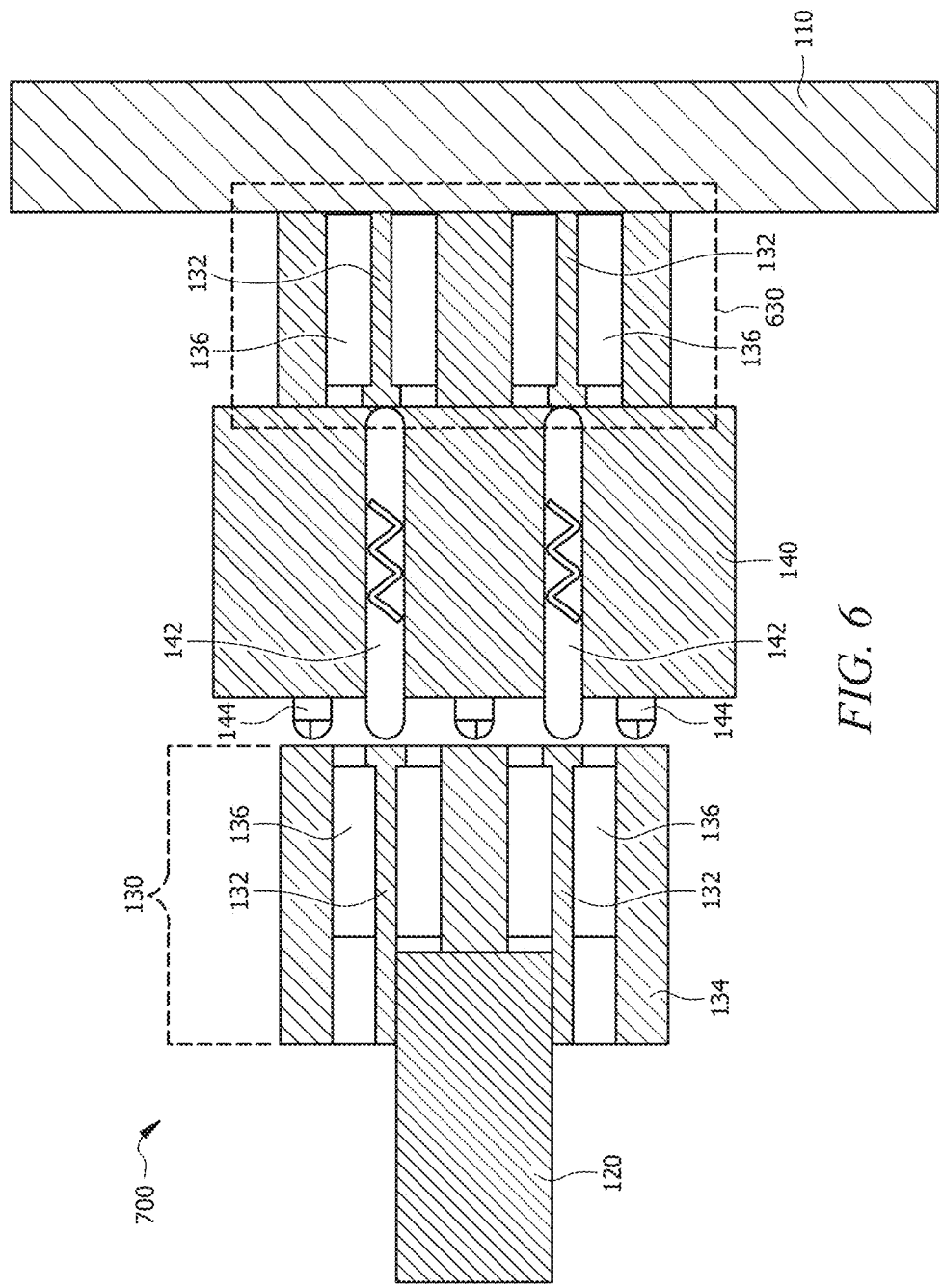
FIG. 6 illustrates a cutaway view of an orthogonal coaxial connection system that utilizes a vertical riser.

FIG. 6 illustrates a cutaway view of an orthogonal coaxial connection system that utilizes a vertical riser, according to some embodiments. This embodiment is identical to the embodiment of FIGS. 2A-2D except for the addition of vertical riser 630. In FIGS. 2A-2D, spring interposer 140 is coupled directly to main circuit board 110. In the embodiments of FIG. 6, however, vertical riser 630 is coupled to main circuit board 110 and then spring interposer 140 is electrically coupled to vertical riser 630. This may allow for more clearance between orthogonal circuit board 120 and main circuit board 110. In some embodiments, vertical riser 630 is similar or identical to orthogonal-to-parallel interface assembly 130 and includes signal pins 132, dielectric retainers 136, and a ground frame 134. Ground frame 134 of vertical riser 630 may be soldered to one or more ground pads of main circuit board 110, and each signal pin 132 of vertical riser 630 may be soldered to a signal pad of main circuit board 110.

Figure 7:
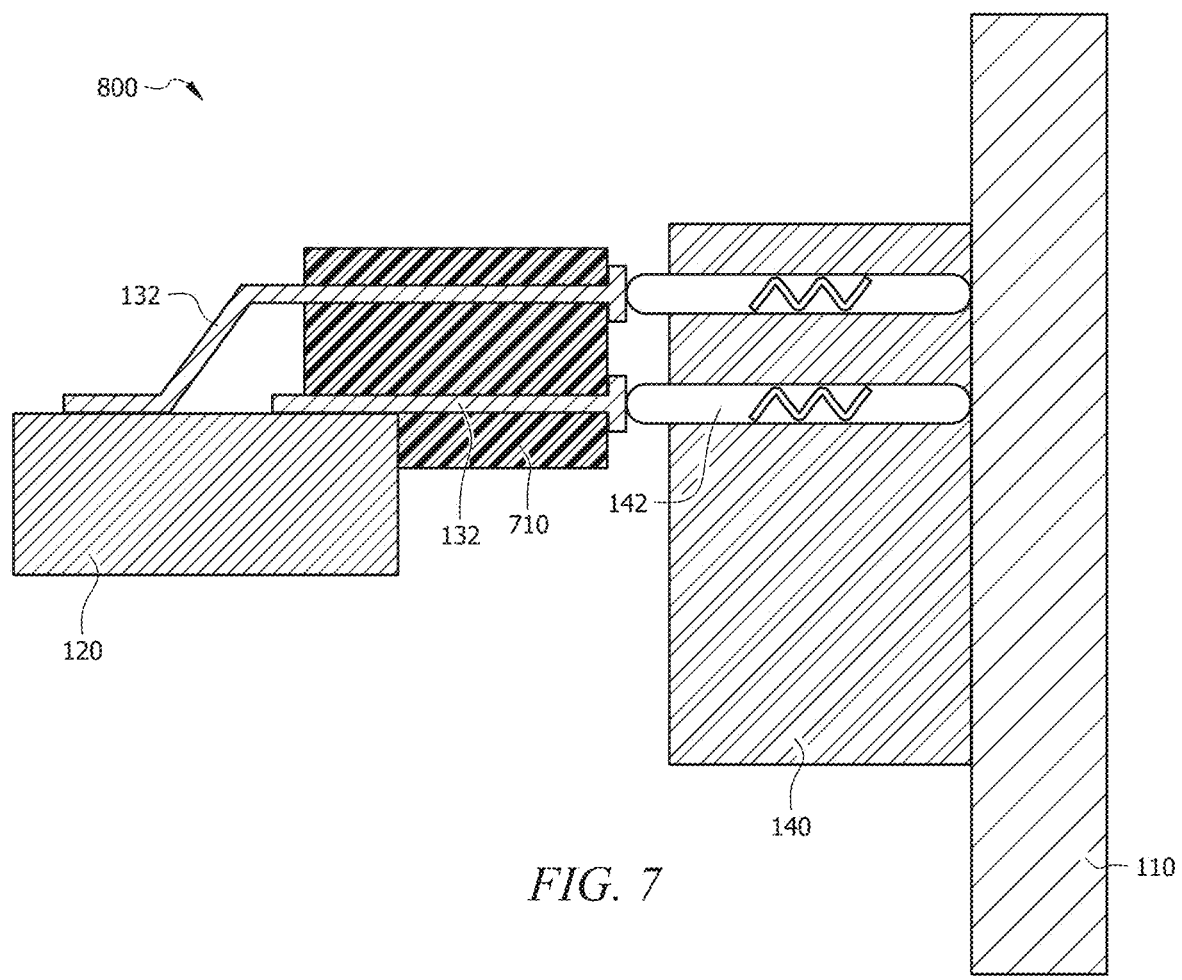
FIG. 7 illustrates a cutaway view of an orthogonal coaxial connection system that utilizes a dielectric housing instead of a ground frame.

FIG. 7 illustrates a cutaway view of an orthogonal connection system 700 that utilizes a dielectric housing 710 instead of a ground frame 134, according to certain embodiments. In these embodiments, the signals transmitted between main circuit board 110 and orthogonal circuit board 120 may be digital signals instead of RF signals but are not limited to transmitting only digital signals. As a result, ground frame 134 is not needed and is instead replaced with a low-cost dielectric housing 710. Dielectric housing 710 may be formed from any appropriate non-conductive dielectric material. In general, dielectric housing 710 may have any appropriate shape or size and functions to arrange signal pins 132 to align with spring signal pins 142 of spring interposer 140.

The scope of this disclosure is not limited to the example embodiments described or illustrated herein. The scope of this disclosure encompasses all changes, substitutions, variations, alterations, and modifications to the example embodiments described or illustrated herein that a person having ordinary skill in the art would comprehend.

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic.

Modifications, additions, or omissions may be made to the methods described herein without departing from the scope of the disclosure. The methods may include more, fewer, or other steps. Additionally, steps may be performed in any suitable order. That is, the steps of any method disclosed herein do not have to be performed in the exact order disclosed, unless explicitly stated.

As used in this document, "each" refers to each member of a set or each member of a subset of a set. Furthermore, as used in the document "or" is not necessarily exclusive and, unless expressly indicated otherwise, can be inclusive in certain embodiments and can be understood to mean "and/or." Similarly, as used in this document "and" is not necessarily inclusive and, unless expressly indicated otherwise, can be inclusive in certain embodiments and can be understood to mean "and/or." All references to "a/an/the element, apparatus, component, means, step, etc." are to be interpreted openly as referring to at least one instance of the element, apparatus, component, means, step, etc., unless explicitly stated otherwise.

Furthermore, reference to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

Although several embodiments have been illustrated and described in detail, it will be recognized that substitutions and alterations are possible without departing from the spirit and scope of the present disclosure, as defined by the appended claims.

The invention claimed is:

1. A system comprising:
a main circuit board;
a spring interposer connector comprising:
 a plurality of signal spring pins, each signal spring pin electrically coupled to a respective signal of the main circuit board; and
 a plurality of ground spring pins, each ground spring pin electrically coupled to a ground signal of the main circuit board; and
an orthogonal circuit board coupled to the main circuit board via an interface assembly, the interface assembly comprising:
 a ground frame electrically coupled to a ground signal of the orthogonal circuit board;
 a plurality of signal pins, each signal pin electrically coupled to a respective signal of the orthogonal circuit board; and
 a plurality of dielectric retainers configured to electrically isolate the plurality of signal pins from the ground frame;
wherein:
 the ground frame comprises an interface surface configured to electrically couple the ground frame to the plurality of ground spring pins of the spring interposer connector;
 each particular signal pin of the interface assembly comprises a pin head configured to electrically couple the particular signal pin to a particular one of the plurality of signal spring pins of the spring interposer connector; and
 the interface surface of the ground frame and the pin heads of the plurality of signal pins form a coplanar surface on the interface assembly.

2. The system of claim 1, wherein the ground frame is soldered to one or more ground contacts on the orthogonal circuit board.

3. The system of claim 1, wherein the coplanar surface of the interface assembly is a predetermined distance away from an edge of the orthogonal circuit board.

4. The system of claim 1, wherein the spring interposer connector is coupled directly to the main circuit board.

5. The system of claim 1, wherein the spring interposer connector is coupled to a vertical riser that is attached to the main circuit board.

6. The system of claim 1, wherein the plurality of signal pins of the interface assembly are arranged in a single row.

7. The system of claim 1, wherein the plurality of signal pins of the interface assembly are arranged in a first row and a second row.

8. The system of claim 7, wherein:
the orthogonal circuit board comprises a first side and a second side opposite from the first side;
signal pins of the first row are coupled to the first side of the orthogonal circuit board; and
signal pins of the second row are coupled to the second side of the orthogonal circuit board.

9. The system of claim 7, wherein:
the orthogonal circuit board comprises a first side and a second side opposite from the first side;
signal pins of the first row are coupled to the first side of the orthogonal circuit board; and
signal pins of the second row are coupled to the first side of the orthogonal circuit board.

10. A system comprising:
a first circuit board;
a spring interposer comprising:
 a plurality of signal spring pins; and
 a plurality of ground spring pins; and
a second circuit board coupled to the first circuit board via an interface assembly, the interface assembly comprising:
 a frame electrically coupled to a ground signal of the second circuit board;
 a plurality of signal pins; and
 a plurality of dielectric retainers configured to electrically isolate the plurality of signal pins from the frame;
wherein:

the frame comprises an interface surface configured to electrically couple the frame to the plurality of ground spring pins of the spring interposer;

each particular signal pin of the interface assembly comprises a pin head configured to electrically couple the particular signal pin to a particular one of the plurality of signal spring pins of the spring interposer; and the interface surface of the frame and the pin heads of the plurality of signal pins form a coplanar surface.

11. The system of claim 10, wherein the frame is soldered to one or more ground contacts on the second circuit board.

12. The system of claim 10, wherein the coplanar surface of the interface assembly is a predetermined distance away from an edge of the second circuit board.

13. The system of claim 10, wherein the spring interposer is coupled directly to the first circuit board.

14. The system of claim 10, wherein the spring interposer connector is coupled to a vertical riser that is attached to the first circuit board.

15. The system of claim 10, wherein the plurality of signal pins of the interface assembly are arranged in a single row.

16. The system of claim 10, wherein the plurality of signal pins of the interface assembly are arranged in a first row and a second row.

17. The system of claim 16, wherein:

the second circuit board comprises a first side and a second side opposite from the first side;

signal pins of the first row are coupled to the first side of the second circuit board; and signal pins of the second row are coupled to the second side of the second circuit board.

18. The system of claim 16, wherein:

the second circuit board comprises a first side and a second side opposite from the first side;

signal pins of the first row are coupled to the first side of the second circuit board; and signal pins of the second row are coupled to the first side of the second circuit board.

19. An interface assembly for coupling an orthogonal circuit board to a main circuit board, the interface assembly comprising:

a frame electrically coupled to a ground signal of the orthogonal circuit board;

a plurality of signal pins; and a plurality of dielectric retainers configured to electrically isolate the plurality of signal pins from the frame;

wherein:

the frame comprises an interface surface configured to electrically couple the frame to a plurality of ground spring pins of a spring interposer of the main circuit board;

each particular signal pin of the interface assembly comprises a pin head configured to electrically couple the particular signal pin to a particular one of a plurality of signal spring pins of the spring interposer; and the interface surface of the frame and the pin heads of the plurality of signal pins form a coplanar surface.

20. The interface assembly of claim 19, wherein:

the plurality of signal pins of the interface assembly are arranged in a first row and a second row;

the orthogonal circuit board comprises a first side and a second side opposite from the first side;

signal pins of the first row are coupled to the first side of the orthogonal circuit board; and signal pins of the second row are coupled to the second side of the orthogonal circuit board.

* * * * *